US012284768B2

(12) United States Patent
Friedrich et al.

(10) Patent No.: US 12,284,768 B2
(45) Date of Patent: Apr. 22, 2025

(54) PRESS-IN MACHINE FOR PRESSING COMPONENTS INTO A SUBSTRATE, IN PARTICULAR INTO A PRINTED CIRCUIT BOARD OR CARRIER PLATE, WITH CHANGING UNIT

(71) Applicant: ERSA GmbH, Wertheim (DE)

(72) Inventors: Kevin Friedrich, Wertheim (DE); Lothar Schwab, Bischbrunn (DE); Kathrin Englert, Marktheidenfeld (DE); Sebastian Becker, Erlenbach (DE)

(73) Assignee: ERSA GmbH, Wertheim (DE)

( * ) Notice: Subject to any disclaimer, the term of this patent is extended or adjusted under 35 U.S.C. 154(b) by 432 days.

(21) Appl. No.: 17/980,267

(22) Filed: Nov. 3, 2022

(65) Prior Publication Data

US 2023/0137203 A1    May 4, 2023

(30) Foreign Application Priority Data

Nov. 4, 2021   (DE) ..................... 10 2021 128 728.6

(51) Int. Cl.
*H05K 3/30*     (2006.01)
*H01R 12/58*    (2011.01)
*H05K 3/32*     (2006.01)

(52) U.S. Cl.
CPC .......... *H05K 3/308* (2013.01); *H01R 12/585* (2013.01); *H05K 3/325* (2013.01); *H05K 2201/1059* (2013.01)

(58) Field of Classification Search
CPC ................. H05K 3/308; H05K 3/325; H05K 2201/1059; H01R 12/585

(Continued)

(56) References Cited

U.S. PATENT DOCUMENTS

| 5,115,545 A | * | 5/1992 | Fujimoto | ................ H01L 24/83 |
| | | | | 29/842 |
| 10,123,429 B2 | * | 11/2018 | Brockerhoff | ........... H05K 3/325 |
| 2018/0027655 A1 | | 1/2018 | Brockerhoff et al. | |

FOREIGN PATENT DOCUMENTS

| CN | 105075420 B | * | 9/2018 | ......... H05K 13/0413 |
| EP | 1194029 A1 | * | 4/2002 | ....... H01L 21/67144 |
| WO | WO-2014129195 A1 | * | 8/2014 | ......... H05K 13/0413 |

OTHER PUBLICATIONS

Examination Report, dated Oct. 18, 2022, File No. 102021128728.6, pp. 1-5.

* cited by examiner

*Primary Examiner* — Peter G Leigh
(74) *Attorney, Agent, or Firm* — BOND, SCHOENECK & KING, PLLC; George R. McGuire

(57) ABSTRACT

Press-in machine for pressing electrical, electronic, mechanical and/or electromechanical components into a substrate, in particular into a circuit board or carrier board, including a lower tool, which for pressing-is in contact against the underside of the substrate, an upper tool, which with an upper pressing unit for pressing-in the component can be moved against the component along the z-axis toward the substrate, and a changing unit for automatically changing the lower or upper tool. The changing unit includes a magazine in which a plurality of tools can be deposited, one or more tool-holders, a tool being provided in or on each of the tool-holders, a displacement unit with which the respective tool holder can be moved along a displacement direction out of the magazine and into a pressing receptacle of a pressing unit, and a locking device, with which the respective tool-holder can be locked in the pressing receptacle.

13 Claims, 4 Drawing Sheets

(58) Field of Classification Search
USPC .......................................................... 439/78
See application file for complete search history.

PRESS-IN MACHINE FOR PRESSING COMPONENTS INTO A SUBSTRATE, IN PARTICULAR INTO A PRINTED CIRCUIT BOARD OR CARRIER PLATE, WITH CHANGING UNIT

CROSS-REFERENCE TO RELATED APPLICATION

The present application relates and claims priority to German Patent Application No. 10 2021 128 728.6 filed with the German Patent Office on Nov. 4, 2021, the entirety of which is hereby incorporated by reference.

BACKGROUND

The invention relates to a press-in machine for pressing electrical, electronic, mechanical and/or electromechanical components into a substrate, in particular into a printed circuit board or carrier board.

Such press-in machines are regularly used in the production of a large number of identical circuit boards populated with electrical, electronic, mechanical and/or electromechanical components. The pressing of the components into printed circuit boards represents in particular an alternative to soldering the components. In particular, it has the advantage that no melting of solder tin is required, that no resulting process gas has to be discharged and that overall the joining process is subject to a comparatively lower energy consumption.

The pins provided on the electrical, electronic, mechanical and/or electromechanical components are pressed into metallized holes provided in the substrate during pressing. An excessive pressing occurring during the pressing-in can be absorbed either by deformation in the metallized hole or by the deformation of the pin. Overall, a very reliable and also robust connection results. Pressing-in can be carried out in particular such that the metal partners are joined by cold welding.

It has been found desirable to use press-in machines flexibly, in particular for pressing-in different components into one and the same substrate or into different substrates.

In particular when different substrates with different components are to be joined in a press-in machine, it is necessary to use different tools for pressing-in different components.

SUMMARY OF THE INVENTION

The object of the present invention is to enable a tool change of the press-in tools in a simple manner.

The object is achieved by a press-in machine for pressing electrical, electronic, mechanical and/or electromechanical components into a substrate.

Such a press-in machine comprises in particular a lower tool which can, during or before pressing-in, be moved together with a lower pressing unit along a z-axis and against the underside of the substrate. The lower tool can also be provided in a stationary design, and the substrate with the components to be pressed-in can be placed on the lower tool.

Furthermore, an upper tool is provided which can be moved together with an upper pressing unit along the z-axis toward the substrate and against the component for pressing-in the component. Pressing-in is ultimately carried out by the upper tool, which presses the component into the substrate, against the underside of which the lower tool is in contact for deflecting the press-in forces.

Furthermore, a changing unit is provided for automatically changing the lower and/or upper tools, wherein the changing unit comprises a magazine in which a plurality of tools can be deposited, one or more tool-holders, wherein a tool is provided in or fastened on each of the tool-holders, a displacement unit with which the respective tool-holder can be moved along a displacement direction out of the magazine into a pressing receptacle of a pressing unit, and a locking device with which the respective tool-holder can be locked in the pressing receptacle.

By providing such a changing unit, an automated and reliable changing of the tools is possible in a simple manner. The tools can be the lower tools and/or also the upper tools. Depending on the component to be pressed in, it may be necessary to change the lower and the upper tools. By providing a magazine with a plurality of tools, different tools can be kept ready. The tool-holders, which provide the respective tool and/or in which the respective tool is fastened, can form a kind of adapter between the tools and the magazine. In particular, the interface between the tool-holders and the respective tools can be adapted to the respective tool. Different tool-holders can provide different interfaces.

It is also conceivable for the tool-holder and the tool to be formed in one piece and in one part; the respective tool then comprises the associated tool holder.

By provision of the displacement unit, the respective tool-holder together with the tool can be moved into and out of the pressing receptacle of the pressing unit in a simple manner. The tool-holder with that tool which is used for pressing-in can thereby be introduced into the pressing receptacle of the pressing unit and taken back out of it.

The locking device is provided for fixing the tool-holder together with the tool in the pressing receptacle. With said locking device, the tool-holder together with the tool is fixed with positional accuracy in the pressing receptacle.

Advantageously, the displacement unit is designed such that it pushes the respective tool-holder together with the tool out of the magazine and into the pressing receptacle. In order to ensure a reliable displacement, it is conceivable for guides to be provided for guiding the tool-holder. For example, linear guides can be provided, such as guide grooves. The displacement unit can comprise, for example, an electric motor, pneumatic cylinder or the like for implementing the sliding movement.

Furthermore, it is advantageous if the respective tool-holder has a coupling element and if the displacement unit comprises a coupling head, wherein the coupling head interacts with the coupling element in such a way that the coupling head pulls the coupling element out of the pressing receptacle and into the magazine. Such a pulling-out of the tool-holder together with the tool from the pressing receptacle and into the magazine can likewise be effected in a comparatively simple manner.

In particular, the coupling element is magnetizable and the coupling head comprises a magnetic element, preferably an electromagnet, which can be energized to activate the coupling head. An energization thus preferably takes place when the tool-holder is to be pulled out of the pressing receptacle by the magnetic element. If the tool-holder is to be inserted into the pressing receptacle, the magnetic element can be deactivated or deenergized.

The magazine preferably has a plurality of sliding receptacles running parallel to one another, into which the respective tool-holder can be inserted and pulled out. Here, the sliding receptacles can be designed in the manner of a groove and the tool-holder can be formed in the manner of a T-piece so that the section of the tool-holder formed in the manner of a T-piece can be inserted into the groove of the respective sliding receptacle. As a result, a large number of different tools can be arranged next to one another in a comparatively space-saving manner in the magazine.

Furthermore, it is advantageous if the magazine is guided by means of a magazine drive displaceably along a magazine guide extending transversely to the displacement direction. This embodiment has the advantage that the displacement unit can be arranged to be stationary. By moving the magazine along the magazine guide, the tool-holder with the tool that is to be used for the pressing-in can be moved in the displacement range of the displacement unit and can finally be inserted by the displacement unit into the pressing receptacle.

Furthermore, it is conceivable for the pressing receptacle to be provided on a rotary element mounted rotatably about an axis of rotation and for a rotary drive to be provided for rotating the rotary element. This has the advantage that the tool-holder together with the tool can be aligned by rotating toward the component to be pressed in. The tool can consequently be oriented according to the component to be pressed in.

A further development of the invention provides that the locking device comprises a locking bolt which is displaceable axially between a locking position and a release position and interacts on the side of the tool-holder facing away from the tool with the tool-holder in order to lock the tool-holder in the pressing receptacle. Then, when the locking bolt is in the release position, the tool-holder can be retracted into the pressing receptacle or moved out. Then, if a tool-holder is present in the pressing receptacle, it can be fixed there by moving the locking bolt into the locking position. On its side facing away from the tool, the tool-holder can provide a recess, a hole, a cone or the like with which the locking bolt interacts in the pressing receptacle for securing the position and locking the tool-holder. In order to move the locking bolt between the locking position and the release position, a bolt drive is preferably provided which can be designed, for example, as an electric motor, pneumatic cylinder or the like.

In order to enable a rotation of the pressing receptacle about the axis of rotation despite the provision of the locking bolt, the locking bolt is preferably arranged along the axis of rotation of the pressing receptacle or the rotary part. A rotation of the pressing receptacle is then possible without hindering the locking bolt.

Furthermore, it is advantageous if a readable coding is provided on the tool-holder for identifying the tool and if a reading unit for reading the coding is provided on the displacement unit. As a result, it can be ensured that prior to the introduction of the respective tool-holder together with the tool into the pressing receptacle, it is possible to check which tool is present for introduction into the pressing receptacle. Thus it can consequently be ruled out that a tool which is not suitable for pressing-in the component to be pressed-in is introduced into the pressing receptacle.

Furthermore, when a plurality of different tools is present, it is advantageous for interfaces between the tool-holders and the respective tools to have different designs. The background for this is that tools from different manufacturers can be used; in particular, in the case of pressing-in, tools are regularly supplied or prescribed by the component manufacturers of the components that are to be pressed in. The individual tool-holders then serve as adapters between the tools and the changing unit.

In addition, it is advantageous if, when a plurality of different tools is present, the tool-holders each have different heights extending in the z axis. Consequently, the tool-holders can provide height compensation if the tools require different heights. A height compensation is also necessary in particular when other components are already present on the substrate next to the components to be pressed-in and have a certain height.

Furthermore, it is advantageous if a moving unit is provided which comprises a receptacle for the substrate with which the substrate can be moved in a plane which is defined by an x-axis and a y-axis and can be placed in a press-in position in which one or more components are pressed into the substrate. The x-axis and the y-axis are arranged orthogonally to one another and lie in particular within a horizontal plane. Such a moving unit has the advantage that the tools can be arranged so as to be movable only in the z-direction.

Furthermore, it is advantageous if a control unit is provided which is provided for controlling the individual units, such as for example the lower pressing unit, the upper pressing unit, the displacement unit, the locking device, the magazine drive, the rotary drive and/or the moving unit. By providing such a control unit, an automated change of the tools in the press-in machine can be effected.

Further details and advantageous embodiments of the invention can be found in the following description, on the basis of which an exemplary embodiment of the invention is described and explained in more detail.

DETAILED DESCRIPTION

Figure 1:
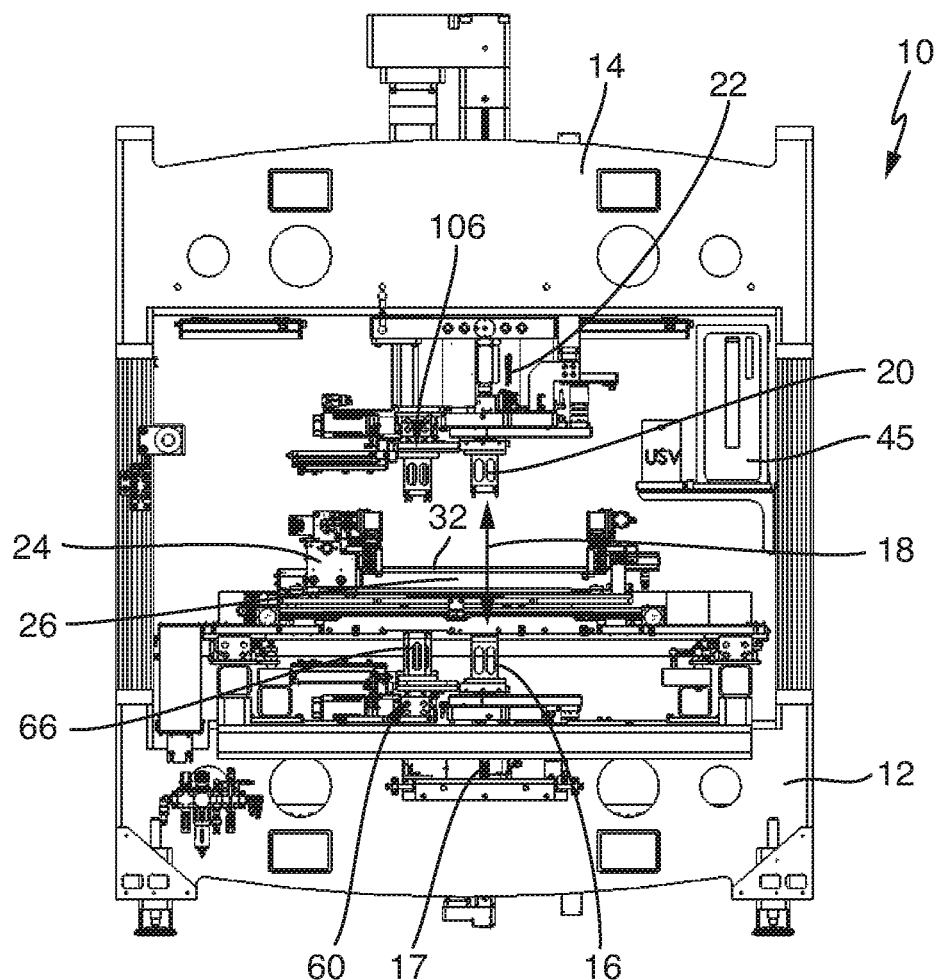
FIG. 1 a press-in machine.

FIG. 1 shows a press-in machine 10 which has a base body 12 and a gantry 14. A lower tool 16 is provided on the base body 12 which with a lower pressing unit 17 is movably arranged along a vertically running z-axis 18. An upper tool 20 which interacts with the lower tool 16 during the pressing-in process is shown on the gantry 14, said upper tool 20, which together with an upper pressing unit 22 which engages in the gantry 14, being movable along the z-axis 18 toward a substrate 32 in the form of a printed circuit board or carrier board.

The press-in machine 10 comprises a moving unit 24 which provides a receptacle 26 for the substrate 32 to be processed.

On the substrate 32 there are in particular electrical, electronic, mechanical and/or electromechanical components (not shown in the figures) with pins which are pressed by the press-in machine 10 into the substrate 32. The pins of the components can be plugged into or slightly inserted into metallized through-holes which are provided in the substrate 32.

With the moving unit 24, the substrate 32 can be moved along an x-axis 34 and a y-axis 36, which are arranged perpendicular to the z-axis 18, into a press-in position. After reaching the press-in position, the lower tool 16 is moved along the z-axis against the underside of the substrate 32, so that the tool 16 comes into contact against the substrate 32. The pressing-in is finally carried out by the upper tool 20, that the component is pressed into the substrate 32, while on the underside of the substrate 32 the lower tool 16 deflects press-in forces into the base body 12. Consequently, one or more components placed on the substrate 32 can be pressed into different press-in layers by means of the tools 16 and 20 simultaneously or sequentially by moving the substrate 32 into different press-in layers in the substrate 32.

Furthermore, a control unit 45, for example a PLC controller, is provided, which is configured for driving the moving unit 24 along the x-axis 34 and the y-axis 36. With the control unit 45, the upper tool 20 and the lower tool 16 can also be moved along the z-axis 18 independently of one another and away from one another.

Figure 2:
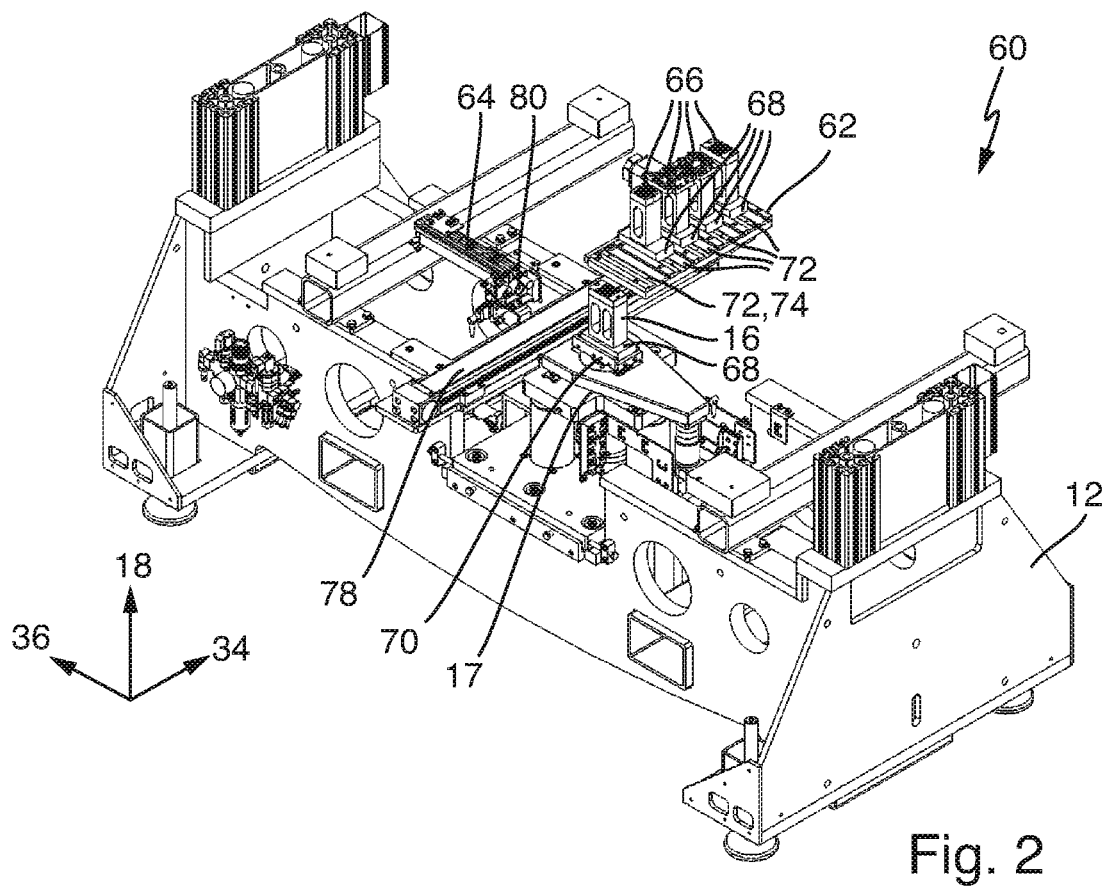
FIG. 2 a changing unit of the press-in machine according to FIG. 1 having a magazine in the parked position.
Figure 6:
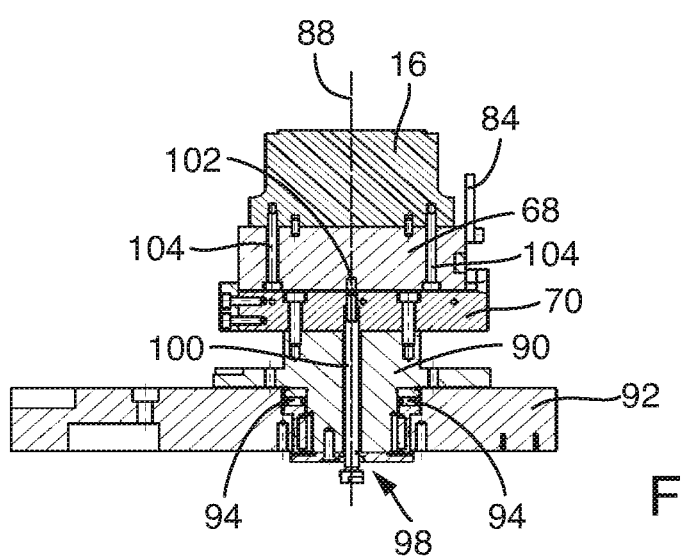
FIG. 6 a longitudinal section through the upper part of the pressing unit according to FIG. 5.

FIG. 2 shows a changing unit 60 for changing the lower tool 16. The changing unit 60 is provided on the base body 12 and comprises a magazine 62 and a displacement unit 64. A plurality of tools 66 is stored in the magazine 62. The tools 66 are each rigidly fastened to a tool-holder 68. In FIG. 2, the magazine 62 with tools 66 is located in a parked position. The tool 16 is located in a pressing receptacle 70 of the pressing unit 17, where it is fixed by means of a locking device 98, which is shown in FIG. 6 and is described further below.

The magazine 62 has a plurality of sliding receptacles 72 running parallel to one another, wherein in FIG. 2 only one sliding receptacle 74 is free and the other sliding receptacles 72 are occupied by the tools 66.

Figure 3:
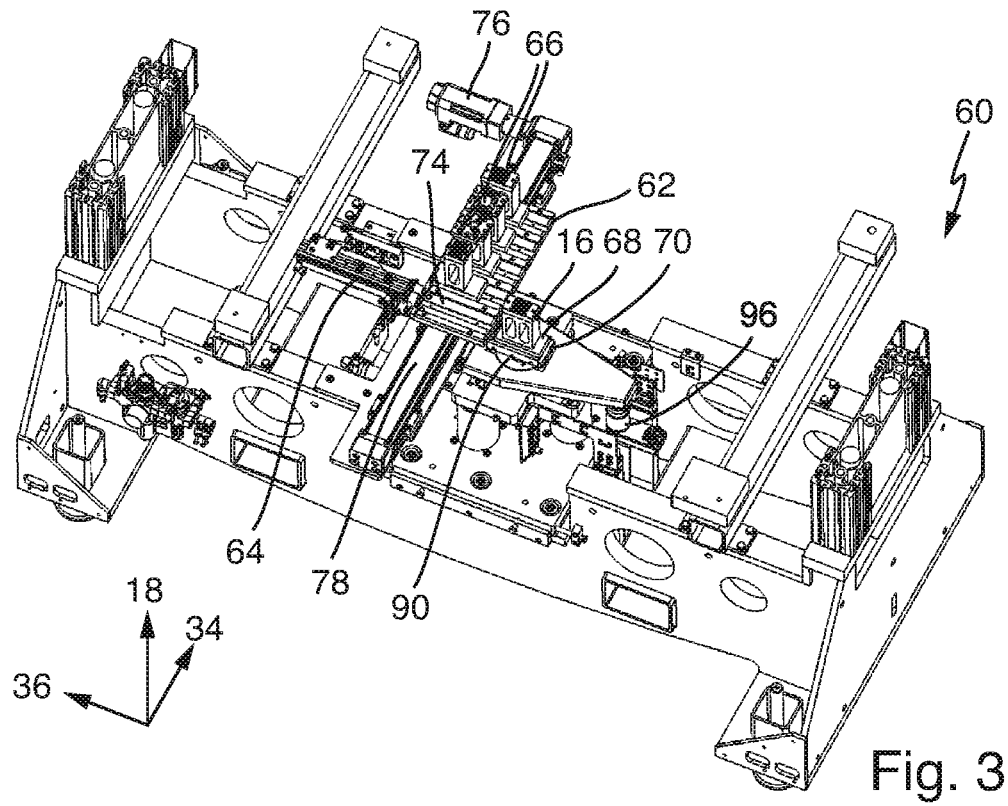
FIG. 3 the changing unit according to FIG. 2 having the magazine in a changing position.

To replace the tool 16 that is present in the pressing receptacle 70 for one of the tools 66, the magazine 62 can be moved by means of a magazine drive 76, which can be seen in FIG. 3, from the parked position shown in FIG. 2 along a magazine guide 78 into a changing position shown in FIG. 3.

Figure 4:
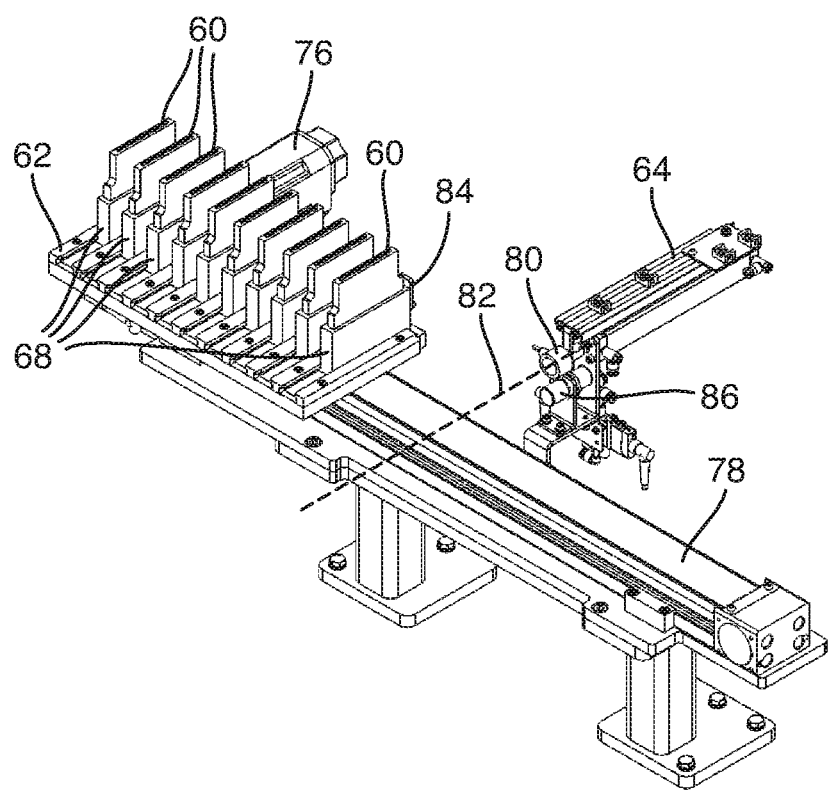
FIG. 4 an isometric view of the magazine and of a displacement unit of the changing unit according to FIGS. 2 and 3.

In FIG. 3 the magazine 62 is consequently located in the changing position, in which the free sliding receptacle 74 is oriented toward the pressing receptacle 70. In order now to move the tool 16 into the free sliding receptacle 74, the displacement unit 64 can be actuated in such a way that a coupling head 80 of the displacement unit 64, which can be clearly seen in FIG. 4, is displaced along a displacement direction 82 from a retracted position shown in FIGS. 2 and 3 into an extended position, so that the coupling head 80 acts against a coupling element 84 present on the tool-holder 68. The coupling element 84 can, for example, be a magnetizable plate which is provided on the respective tool-holder 68. For moving the coupling head 80 between the retracted position and the extended position, it is conceivable for the moving unit to comprise a drive, for example a pneumatic drive with a piston-cylinder unit.

The coupling head 80 can be switched between a magnetized state and a non-magnetized state by means of a magnetic element (not shown), in particular an electromagnet. If the tool 16 is now to be moved out of the pressing receptacle 70 into the free sliding receptacle 74, the coupling head 80 in the magnetized state will move against the magnetizable coupling element 80 provided on the tool-holder 68. After the locking device 98, which locks the tool-holder 68 in the pressing receptacle 70, is released, the tool-holder 68 together with the tool 16 can be moved out of the pressing receptacle 70 along the displacement direction 82 into the sliding receptacle 74 by moving the coupling head 80 back from the extended position into the retracted position. The coupling head 80 or its magnetic element pulls the tool-holder 68 out of the pressing receptacle 70 and into the free sliding receptacle 74.

In order now to introduce a different tool 66 into the pressing receptacle 70, the magazine 62 can be moved via the magazine drive 76 such that the tool 66 which is to be used is aligned along the displacement direction 82 and along the pressing receptacle 70. In a next step, the respective tool 66 or its tool-holder 68 can be inserted into the pressing receptacle by means of the displacement unit 64 along the displacement direction 82. For this purpose, the coupling head 80 is moved in the displacement direction against the coupling element 84 from the retracted position into the extended position until the respective tool-holder 68 has assumed its position in the pressing receptacle 70.

To ensure that the correct tool 66 is inserted into the pressing receptacle 70, readable codings are provided on the tool-holders 68 for identifying the respective tool 66. Furthermore, a reading unit 86, which can be clearly seen in FIG. 4, is provided on the displacement unit 64 and can be used to read the respective coding. The readable coding can in particular be a bar code, a QR code, an RFID code or the like.

Figure 5:
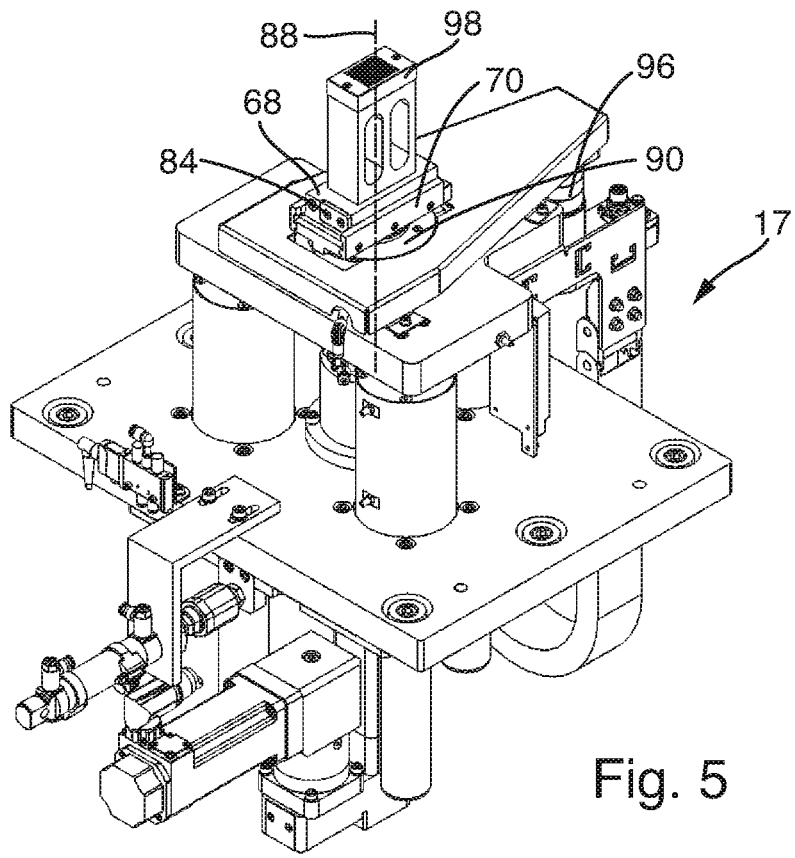
FIG. 5 the lower pressing unit of the press-in machine according to FIG. 1.

As is clear from FIGS. 5 and 6, the pressing receptacle 70 is provided on a rotary element 90 mounted rotatably about an axis of rotation 88. For this purpose, pivot bearings 94 are present between the rotary element 90 and an upper carrier 92 of the lower pressing unit 17. Furthermore, a rotary drive 96 is provided with which the rotary element 90, and thus the tool 16, can be rotated about the axis of rotation 88. As a result, the tool 16 or the tools 60 can be oriented toward the components to be pressed in.

In order to lock the respective tool-holder 68 in the pressing receptacle 70, as is clear from the section according to FIG. 6, the locking device 98 is provided with a locking bolt 100 that can be displaced axially between a locking position and a release position. Here, the locking bolt in the locking position interacts with a recess 102 provided on the side of the tool-holder 68 facing away from the tool 16. To displace the locking bolt 100 between the locking position and the release position, a bolt drive (not shown in more detail) is provided which can drive the locking bolt 100 either rotationally or axially for axial displacement.

As is clear from FIG. 6, the locking bolt 100 is arranged along the axis of rotation 88. This has the advantage that rotation of the tool 16 about the axis of rotation 88 is possible independently of the presence or the position of the locking bolt 100.

As is further apparent from FIG. 6, the tool 16 is rigidly fastened to the respective tool-holder 68 by means of fastening screws 104. However, it is also conceivable for the particular tool 16 to be integrally formed with the respective tool-holder 68. Depending on the components to be pressed in, different tools can be used. The interfaces between the tools 16, 20, 66 and the respective tool-holders 68 can also be designed differently, tool-specifically. However, the interfaces between the tool-holders 68 and the magazine 62 or the pressing receptacle 70 are preferably designed identically. In particular, the heights of the tools 16, 66 extending in the z-axis 18 and also of the tool-holders 68 can be different, depending on the components to be pressed in and depending on the given requirements.

The lower changing unit 60 for the respective lower tool 16 is shown in FIGS. 2 to 6 and described in the foregoing. In accordance with the design of the lower changing unit 60, as is indicated in FIG. 1, an upper changing unit 106 can also be provided which is designed in accordance with the lower changing unit 60.

Consequently, the lower tools 16 and the upper tools 20 can be replaced automatically by means of the changing units 60 and 106. In particular, different components successively placed on a substrate 32, i.e., in particular on a printed circuit board or carrier board, can also be pressed-in with different tools 16, 20.

Here the control unit 45 controls not only the movement of the pressing units 17 and 22 and the moving unit 24, but also the locking device 98, the magazine drive 76, the rotary drive 96 and/or the bolt drive.

What is claimed is:

1. Press-in machine for pressing electrical, electronic, mechanical and/or electromechanical components into a substrate, comprising:
    a lower tool, which comes to rest against the underside of the substrate before or during pressing-in,
    an upper tool, which with an upper pressing unit for pressing-in the component can be moved against the component along the z-axis toward the substrate,
    a changing unit for automatically changing the lower or upper tool, the changing unit comprising:
        a magazine in which a plurality of tools can be deposited,
        one or more tool-holders, a tool being provided in or on each of the tool-holders,
        a displacement unit with which the respective tool holder can be moved along a displacement direction from the magazine into a pressing receptacle of a pressing unit, and
        a locking device, with which the respective tool-holder can be locked in the pressing receptacle.

2. Press-in machine according to claim 1, characterized in that the displacement unit is designed such that it pushes the respective tool-holder together with the tool out of the magazine and into the pressing receptacle.

3. Press-in machine according to claim 1, characterized in that the respective tool-holder in each case has a coupling element and in that the displacement unit comprises a coupling head, the coupling head interacting with the coupling element in such a way that the coupling head pulls the coupling element out of the pressing receptacle and into the magazine.

4. Press-in machine according to claim 1, characterized in that the magazine has a plurality of sliding receptacles, which extend parallel to one another and into which the respective tool holder can be inserted and pulled out.

5. Press-in machine according to claim 1, characterized in that the magazine is displaceably guided by means of a magazine drive along a magazine guide running transversely to the displacement direction.

6. Press-in machine according to claim 1, characterized in that the pressing receptacle is provided on a rotary element which is rotatably mounted about an axis of rotation and that a rotary drive is provided for rotating the rotary element.

7. Press-in machine according to claim 1, characterized in that the locking device comprises a locking bolt which is displaceable axially between a locking position and a release position and interacts with the tool-holder on the side of the tool-holder that is applied to the tool for locking the tool holder in the pressing receptacle.

8. Press-in machine according to claim 7, characterized in that the locking bolt is arranged along the axis of rotation.

9. Press-in machine according to claim 1, characterized in that a readable coding is provided on the tool-holder for identifying the tool and that a reading unit for reading the coding is provided on the displacement unit.

10. Press-in machine according to claim 1, characterized in that, when a plurality of different tools is present, interfaces between the tool-holders and the respective tools will be of different designs.

11. Press-in machine according to claim 1, characterized in that, when a plurality of different tools is present, the tool-holders will each have different heights extending in the z-axis.

12. Press-in machine according to claim 1, characterized in that a moving unit is provided which comprises a receptacle for the substrate with which the substrate can be moved within a plane which is defined by an x-axis and a y-axis and can be placed in a press-in position, in which one or more components are pressed into the substrate.

13. Press-in machine according to claim 1, characterized in that a control unit is provided for controlling the lower pressing unit, the upper pressing unit, the displacement unit and the locking device.

* * * * *